United States Patent [19]

Shima et al.

[11] Patent Number: 5,139,750
[45] Date of Patent: Aug. 18, 1992

[54] SILICON SINGLE CRYSTAL MANUFACTURING APPARATUS

[75] Inventors: Yoshinobu Shima; Kenji Araki; Hiroshi Kamio; Makoto Suzuki, all of Tokyo, Japan

[73] Assignee: NKK Corporation, Tokyo, Japan

[21] Appl. No.: 690,920
[22] PCT Filed: Oct. 12, 1990
[86] PCT No.: PCT/JP90/01319
  § 371 Date: Jun. 14, 1991
  § 102(e) Date: Jun. 14, 1991
[87] PCT Pub. No.: WO91/05891
  PCT Pub. Date: May 2, 1991

[30] Foreign Application Priority Data

Oct. 16, 1989 [JP] Japan .................. 1-268800

[51] Int. Cl.⁵ .......................................... B01D 9/00
[52] U.S. Cl. ............................ 422/249; 156/617.1; 156/618.1; 156/620.4; 156/DIG. 64; 422/248
[58] Field of Search .............. 156/617.1, 618.1, 620.4, 156/620.41, DIG. 64; 422/248, 249

[56] References Cited

U.S. PATENT DOCUMENTS

| | | | |
|---|---|---|---|
| 2,892,739 | 6/1959 | Rusler | 156/DIG. 115 |
| 4,330,362 | 5/1982 | Zulehner | 422/249 |
| 4,911,895 | 3/1990 | Kida et al. | 422/249 |
| 4,957,712 | 9/1990 | Shima et al. | 422/249 |
| 5,009,862 | 4/1991 | Shima et al. | 422/249 |
| 5,009,863 | 4/1991 | Shima et al. | 422/249 |

FOREIGN PATENT DOCUMENTS

| | | |
|---|---|---|
| 56-23679 | 3/1981 | Japan . |
| 1-153589 | 6/1989 | Japan . |
| 1-275495 | 11/1989 | Japan . |
| 2-172885 | 6/1990 | Japan . |

*Primary Examiner*—Robert Kunemund
*Assistant Examiner*—Felisa Garrett
*Attorney, Agent, or Firm*—Michael N. Meller

[57] ABSTRACT

A silicon single crystal manufacturing apparatus which pulls a large-diameter silicon single crystal with improved yield and efficiency according to the rotary CZ method.

As a means of preventing the solidification of molten silicon in the vicinity of a partition member, that is, one of factors which deteriorate the yield and efficiency, a heat shielding member having a predetermined position and shielding width is arranged to face a meniscus position of molten silicon thereby shielding the heat radiation from the meniscus portion.

Its shape is a cylindrical shape, truncated-cone shape or a shape formed at its cylindrical bottom with a flange having a central opening.

Its material primarily consists of a metal such as molybdenum or tantalum or an electric resistance heater.

15 Claims, 11 Drawing Sheets

SILICON SINGLE CRYSTAL MANUFACTURING APPARATUS

TECHNICAL FIELD

The present invention relates to an apparatus for manufacturing large-diameter silicon single crystals in accordance with the Czochralski method.

BACKGROUND ART

In the field of LSIs, the diameter required for silicon single crystals has been increased year after year. At present, silicon single crystals of 6 inches in diameter are used for the latest devices. It is said that in the future silicon single crystals of 10 inches or more in diameter, e.g., silicon single crystals of 12 inches in diameter will be needed.

The silicon single crystal manufacturing methods according to the Czochralski method are classified into two types of conceptions. One type is a method in which a crucible is rotated and the other type is a method in which a crucible is not rotated. At present, all the silicon single crystals according to the CZ method, which are used for LSIs, are manufactured by the method of rotating a crucible and a silicon single crystal in the opposite directions and heating the crucible by an electric resistance heater surrounding the side of the crucible. In spite of many attempts silicon single crystals of over 5 inches in diameter have not been manufactured up to date by any methods in which the crucible is not rotated or by any other heating methods than the above-mentioned one. Nor they will be produced in the future. The reason is that it is impossible to obtain a temperature distribution which is completely concentric with a growing silicon single crystal without the rotation of the crucible and by such heating methods as magnetic induction heating or electric resistance heating from the bottom surface of the crucible. The growth of a silicon single crystal is extremely sensitive to the temperature distribution.

In accordance with the CZ method which rotates the crucible (hereinafter referred to as the ordinary CZ method), a strong convection is caused in the molten silicon owing to the crucible rotation and the electric resistance heater attached to the side of the crucible, and the molten silicon is stired excellently. This is desirable for the growth of a large-diameter silicon single crystal. In other words, a complete and uniform concentric temperature distribution of the molten silicon surface is obtained for the silicon single crystal. Therefore, the present invention is based on the ordinary CZ method. As mentioned previously, there is a great difference in molten silicon flow between the ordinary CZ method and the other CZ method. This difference results in considerable variations in the growth of silicon single crystals. As a result, there are great differences between the two with respect to the functions of the furnace components (e.g. the heater). The two methods differ entirely with respect to the conception for the growth of a silicon single crystal.

In accordance with the ordinary CZ method, the amount of molten silicon within the crucible is decreased as a silicon single crystal grows. Thus, as the silicon single crystal grows, the dopant concentration is increased and the oxygen concentration is decreased in the silicon single crystal. In other words, the properties, e.g., the electric resistivity of the silicon single crystal varies in the direction of its growth. Since the quality required for LSIs has been made severer year after year with increase in the level of integration of LSIs, this problem must be overcome.

As a means of solving this problem, there is known a method in which the interior of a quartz crucible according to the ordinary CZ methods is divided by a cylindrical quartz partition member including holes formed therethrough for molten silicon and a cylindrical silicon single crystal is grown on the inner side of the partition member while feeding granular silicon starting material to the outer side of the partition member (e.g., Patent Publication No. 40-10184, page 1, lines 20 to 35).

As pointed out in Laid-Open Patent No. 62-241889 (page 2, lines 12 to 16), this method is disadvantageous in that solidification of the molten silicon tends to occur on the inner side of the partition member with the partition member as a starting point. The cause for this resides in that as will be seen from the fact that quartz is generally used for optical fibers, the quartz forming the partition member excellently conducts heat by radiation. In other words, the heat in the molten silicon is transmitted as light upwardly through the partition member and it is dissipated from the portion of the partition member which is exposed on the molten silicon surface. As a result, the molten silicon temperature is decreased considerably in the vicinity of the partition member. Also, in accordance with the ordinary CZ method, due to the molten silicon being stirred vigorously, the surface temperature of the molten silicon is not only uniform but also just above the solidification temperature. Due to the combination of these factors, the molten silicon surface contacting with the partition member is in a condition having very high tendency to cause the solidification. To avoid this problem, Laid-Open Patent No. 62-241889 proposes a method which uses no partition member. In this method, however, the starting material melting section is so limited that the ganular silicon starting material melting capacity is extremely small and thus it is not put in practical use as yet.

Laid-Open Patent No. 1-153589 is one proposing a method which employs a partition member and prevents the occurrence of solidification thereat. This laid-open patent proposes to completely cover the partition member with a heat shielding member. In accordance with this method, the dissipation of heat from the partition member can be prevented and hence the occurrence of solidification starting at the partition member can be prevented.

However, due to the presence of the heat shielding member between the electric resistance heater and the silicon single crystal, the heat keeping effect of the electric resistance heater on the silicon single crystal is reduced greatly. In other words, the silicon single crystal tends to be cooled. This results in increase in the thermal stresses caused within the silicon single crystal and also the point defects are frozen, thus increasing the micro-defects which are not desirable for the semiconductor and thereby producing a detrimental effect on the growth of the stable silicon single crystal.

The present invention has been made in view of these circumstances and it is an object of the invention to provide a silicon single crystal manufacturing apparatus which is capable of preventing the occurrence of solidification at the meniscus portion (contacting portion of the partition member and molten silicon) of the partition member and properly maintaining the atmosphere temperature of the silicon single crystal during the growing, thereby effecting the growth of the stable silicon single crystal without the occurrence of dislocations.

DISCLOSURE OF INVENTION

The silicon single crystal manufacturing apparatus according to the present invention is one including a rotation-type quartz crucible containing molten silicon and an electric resistance heater for heating the quartz crucible from the side thereof, a partition member made of a cellular quartz material, arranged to divide the molten silicon into a single crystal growing section and a material melting section within the quartz crucible and having small holes for permitting the molten silicon to flow gently toward the single crystal growing section from the material melting section, starting material feed means for feeding granular silicon starting material to the material melting section, and pull means for pulling a silicon single crystal from the single crystal growing section, wherein a cylindrical heat shielding member is arranged above the molten silicon surface in the single crystal growing section in a manner that the heat shielding member faces the contacting point between the peripheral inner surface of the partition member and the molten silicon surface so as to prevent the dissipation of heat from the contacting point.

The principal construction of the present invention resides in that the heat shielding member is arranged in the vicinity of the meniscus position of the partition member and a cellular quartz material is used as the material of the quartz member for partition member.

Figure 7A:
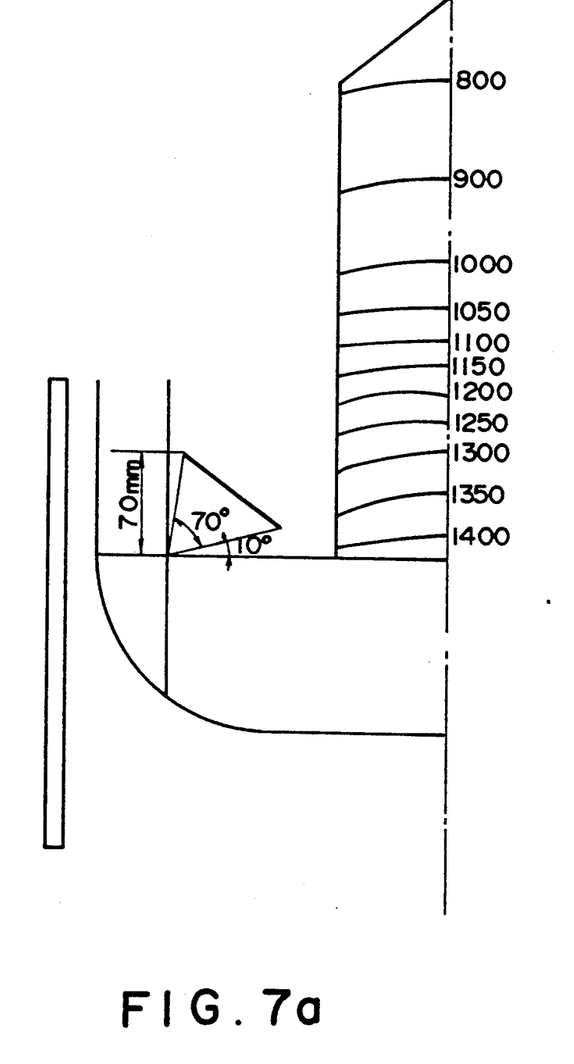
FIGS. 7a and 7b show respectively silicon single crystal temperature distributions in cases where the heat shielding member is arranged (FIG. 7a) and where the whole surface is covered (FIG. 7b)

By doing so, the heat shielding member can fully utilize the effect of reducing the heat radiation from the partition member without deteriorating the heat keeping effect of the electric resistance heater on the silicon single crystal. The above-mentioned proposal is based on the knowledge that the dissipation of heat from the partition member is limited to the vicinity of the molten silicon surface and that this tendency is promoted with increase in the cell content of the quartz material. In addition, the increase in the cell content is effective in reducing the capacity of the partition member to transmit the heat in the molten silicon. The effect of the cell content of the quartz member is due to the fact the transparency of the quartz is decreased with increase in the cell content. The chances of the light or radiant being scattered by the cells is increased with increase in the cell content. In other words, within the molten silicon the transmission of the radiant heat to the upper part of the partition member becomes more difficult with decrease in the transparancy of the quartz material. Still further, as the result of the restraint on the propagation to the upper part, the tendency to limit the place of external heat radiation to the vicinity of the meniscus is increased on the molten silicon surface. Under such condition where the position of the heat radiation from the partition member is limited to the meniscus portion, there is no need to completely cover the partition member with the heat shielding member as in the case of Laid-Open Patent No. 1-153589. Its function can be exhibited fully if only the vicinity of the meniscus is covered. The reason for the direction of the dissipation of heat from the partition member being limited to the crystal growing section resides in that the electric resistance heater exists on the starting material feed section side. In the other words, there is caused the flow of heat from the starting material feed section side to the crystal growing section in this system on the whole. The result of a comparison between the cover which covers the whole surface and the cover of the present invention is as follows: (see FIGS. 7a, 7b and 8).

Figure 7B:
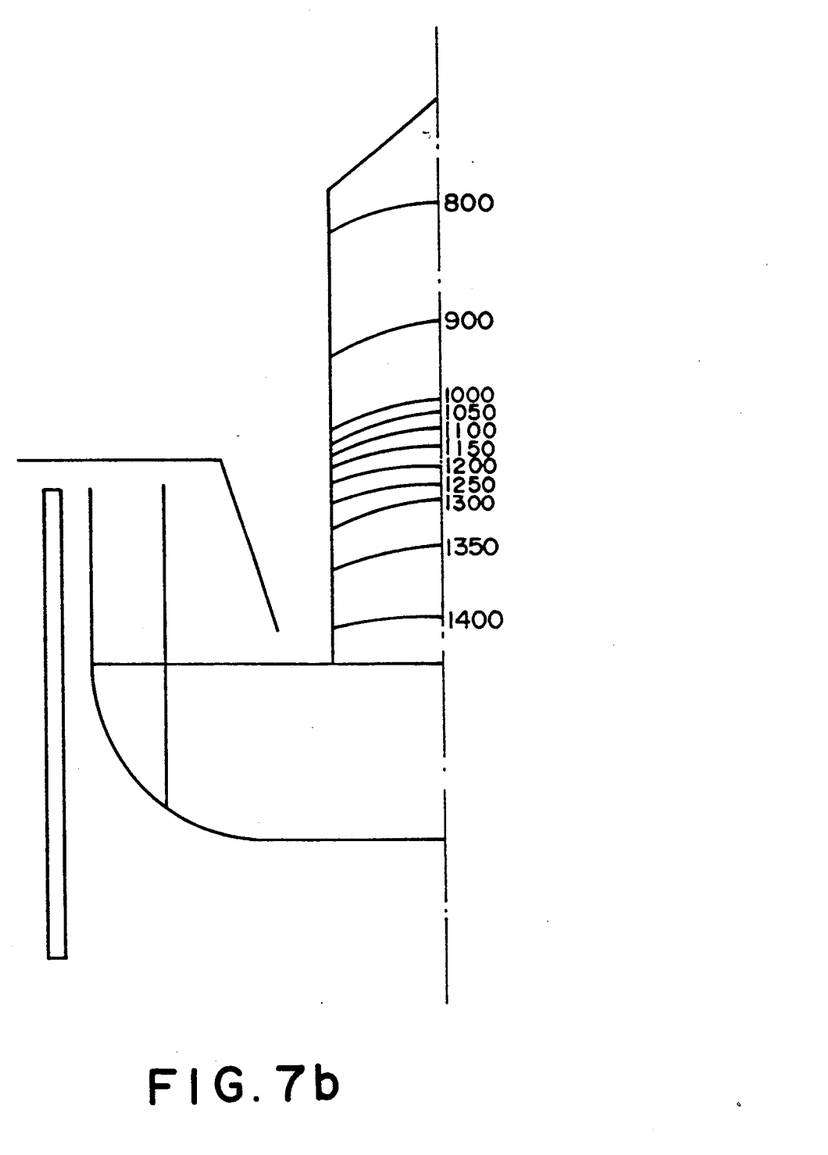
Figure 8:
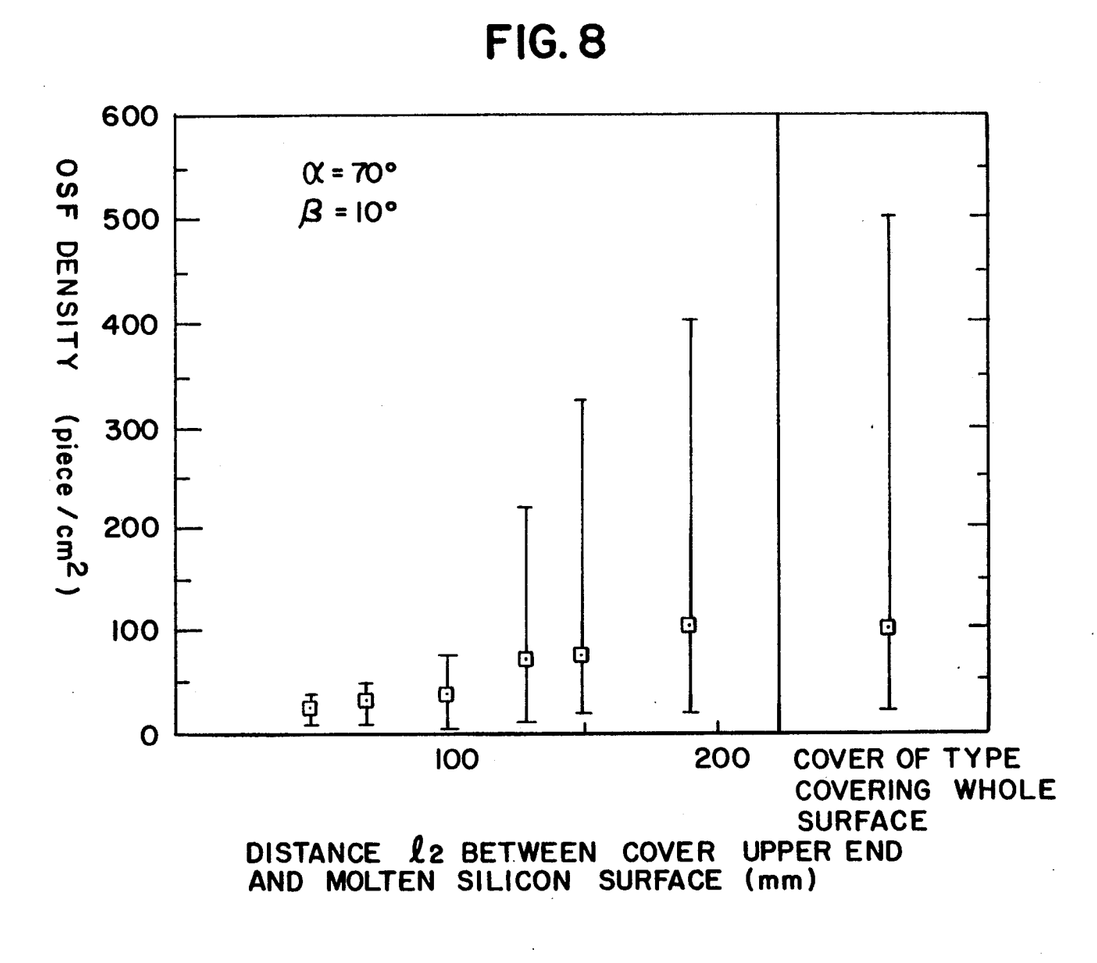
FIG. 8 is an experimental data diagram showing the effect of the distance $l_2$ between the upper end of the heat shielding member and the molten silicon surface.

In the case of the cover which covers the whole surface, the temperature distribution in the crystal is dense in the cover upper part as shown in FIG. 7b indicating that the crystal is cooled rapidly in this portion. This is due to the fact that the heat radiation from the side electric resistance heater is shielded by the cover. On the contrary, in the case of the heat shielding member of the present invention shown in FIG. 7a, the heat radiation from the side electric resistance heater passes along the upper part of the heat shielding member and fails on the crystal so that the temperature distribution is at equal intervals. If the silicon single crystal is cooled rapidly, thermal stresses are increased or point defects are frozen in the cooled portion, thereby increasing micro-defects which are detrimental to the semiconductor. FIG. 8 shows the relation between the cover shape and the density of oxidation induced stacking faults (OSF) which are a kind of the micro-defects. If the upper end of the heat shielding member fully covers or shields the heat radiation from the side electric resistance heater, the OSF density is increased. It is seen that when the distance $l_2$ between the upper end of the heat shielding member and the molten silicon surface is greater than 100 mm, the OSF density is increased. Also, the OSF density is high even in the case of the cover shielding the whole surface.

The consideration given with respect to the position and size of the heat shielding member are as follows. The position of the heat shielding member should preferably be such that the following relations hold with respect to an angle $\alpha$ facing the width of the heat shielding member from the contact point between the partition member inner peripheral surface and the molten silicon surface and an angle $\beta$ facing the gap between the heat shielding member lower end and the molten silicon surface from the same contact points $$20° \leq \alpha \leq 80°, 2° \leq \beta \leq 60°$$

and also the distance $l_2$ between the heat shielding member upper end and the molten silicon surface is not greater than 100 mm. More preferably, the following relations should preferably hold.

$$\alpha \geq 60° - \beta \text{ when } 2° \leq \beta 30°$$

$$\alpha \geq 30° \text{ when } 30° < \beta \leq 50°$$

$$\alpha \geq 80° - \beta \text{ when } 50° < \beta \leq 60°$$

The lower limit of the angle $\beta$ is selected 2° on the ground that if it is smaller, there is the danger of the heat shielding member contacting with the molten silicon and the operation tends to become difficult. The upper limit of the distance $l_2$ between the upper end of the heat shielding member and the molten silicon surface is selected 100 mm on the ground that if it is greater, the action of the heat shielding member to prevent the heat radiation from the electric resistance heater from reaching the silicon single crystal is intensified, that is, the heat keeping effect of the electric resistance heater on the silicon single crystal is deteriorated. The intensity of the heat shielding function of the heat shielding member is determined by the angle $\alpha$ facing the width of the heat shielding member from the previously mentioned contact point and the angle β facing the gap between the heat shielding member lower end and the molten silicon surface from the same contact point.

Basically, if the heat radiation from the meniscus position is prevented, the occurrence of solidification at this portion can be prevented. As regards the heat radiation from this portion, it is only necessary to discuss the solid angle of the heat shielding member. The relation between an angle α facing the width of the heat shielding member from the meniscus and an angle β facing the gap between the heat shielding member lower end and the molten silicon surface from the same meniscus position and the occurrence of solidification will now be discussed.

Firstly, in order to arrange the heat shielding member between a silicon single crystal and the inner wall of the inner crucible, an angle (α+β) must be selected not greater than 82 degrees so as to prevent it from contacting with any of the other component parts. Also, in order to prevent the heat shielding member from contacting with the molten silicon, it is desirable that the angle β is selected to be not less than 2 degrees and that the distance $l_1$ between the heat shielding member lower end and the molten silicon surface is selected to be not less than 5 mm.

Figure 9:
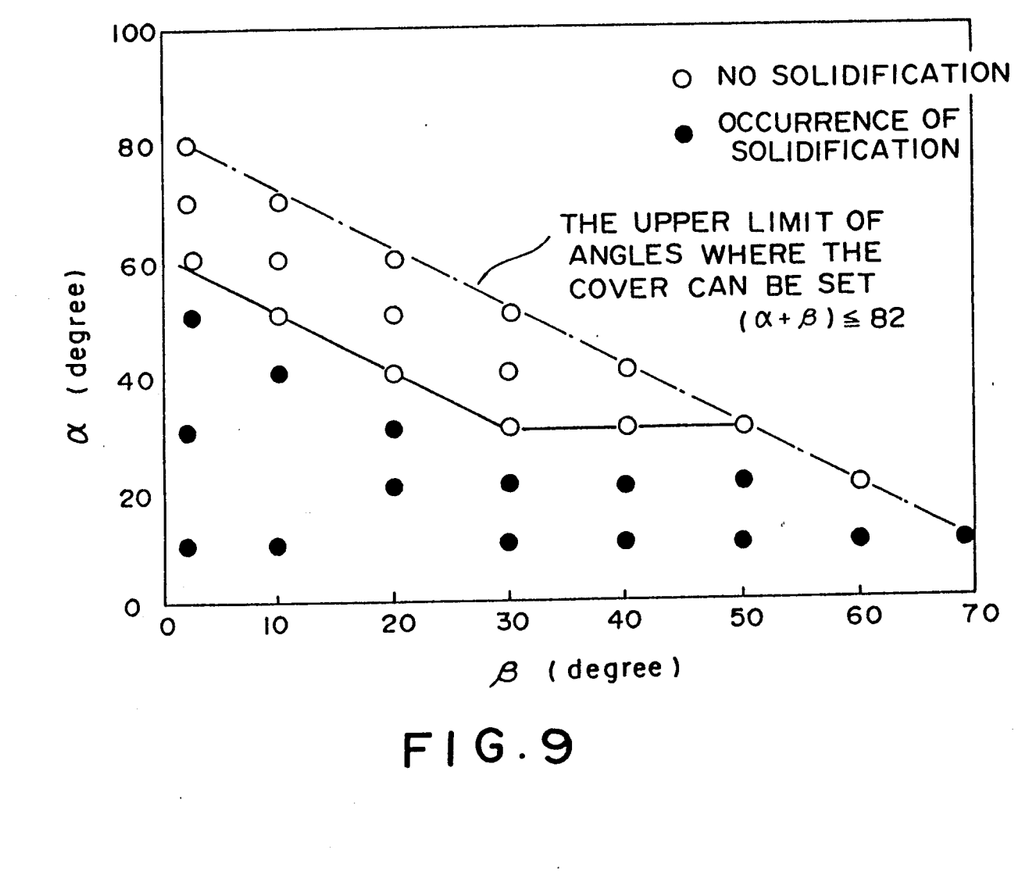
FIG. 9 is an experimental data diagram showing the relation between the angles $\alpha$ and $\beta$ and the solidification of the meniscus and FIG. 10 is a data diagram showing the relation between the angle $\beta$ and the temperature of the meniscus portion.
Figure 10:
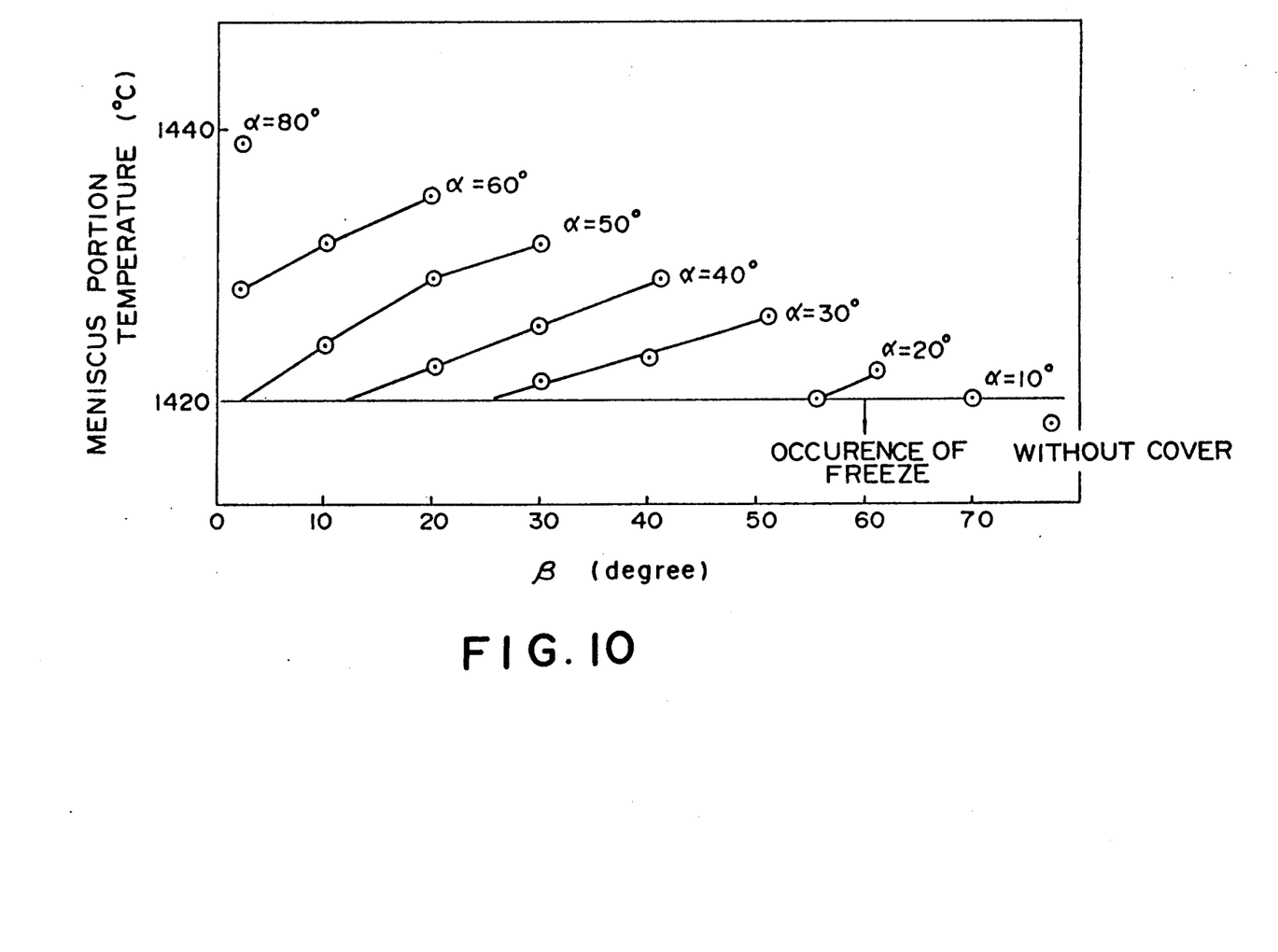

FIG. 9 shows the relation between α and β and the occurrence of solidification at the meniscus portion.

The black circles show cases involving the occurrence of solidification at the meniscus position during the crystal growing and the while circles show cases involving no occurrence of solidification.

Firstly, if the value of α is less than 20 degrees, there is the occurrence of solidification irrespective of the position where the cover is arranged.

In other words, it is indicated that the prevention of heat radiation is not satisfactory.

Where the value of α is 20 degrees, the prevention of solidification is attained only when the value of β is 60 degrees. If β is not greater than 60 degree, there is the occurrence of solidification.

On the other hand, if the value of α is not less than 30 degrees, the heat radiation preventive effect becomes prominent so that there is no occurrence of solidification even if the value of β is decreased more or less.

These phenomena can be explained on the basis of the relation between the meniscus portion temperature and the values of α and β.

In other words, the temperature of the meniscus portion decreases with decreased in the value of α and also the temperature of the meniscus portion decreases with decrease in the value of β. It is considered that the heat radiation preventive effect is decreased with decrease in the value of α and that if the value of β is low, the heat radiation from the meniscus portion toward the water cooled chamber upper cover is increased thereby decreasing the temperature of the meniscus portion.

By reducing the results of FIG. 9, the conditions of α and β for preventing the occurrence of solidification can be concluded as follows: Namely, $\alpha > 60 - \beta$ when $2 < \beta < 30$ $\alpha > 30$ when $30 < \beta 50$ $\alpha > 80 - \beta$ when $50 < \beta < 60$ On the other hand, the range from 0.01 to 15% is preferred for the coil content of the partition member. The lower limit of 0.01% is selected on the ground that if it is smaller, the transparency reducing action of the cells is excessively weak. In other words, the heat in the molten silicon is dissipated through the partition member. The upper limit is selected 15% on the grounded that if it is greater than this value, the growth of the stable silicon single crystal tends to become difficult. The reason is that the chances of the cells being cracked open to break, the quartz into pieces are increased with increase in the cells. It is needless to say that the presence of the cells in the molten silicon is extremely harmful to the growth of the silicon single crystal. The cells in the quartz are grown when the quartz is exposed to a high-temperature and low-pressure condition for along period of time. As a result, the above-mentioned content is the value attained upon the growth of a silicon single crystal. This value can be known by measuring the crucible after the growth of the silicon single crystal.

Since the quartz partition member used has a cell content between 0.01 and 15%, there is the effect of reducing the heat radiation from the partition member, particularly the effect of reducing the heat radiation from the partition member in the vicinity of the meniscus. If the cell content is not greater than 0.01%, the heat radiation reducing effect is reduced. On the other hand, if the cell content exceeds 15%, there is the danger of broken pieces of quartz being produced from the partition member and mixed into the molten silicon. There is no need to completely cover the partition member with the heat shielding member if it is possible to reduce the heat radiation from the partition member in the vicinity of the meniscus and the solidification preventing purpose can be accomplished if only the partition member in the vicinity of the meniscus can be covered. As a result, the heat radiation from the molten silicon surface and the electric resistance heater satisfactorily reach the silicon single crystal being grown so that the silicon single crystal is prevented from being cooled excessively and the thermal stresses are reduced.

Figure 4A:
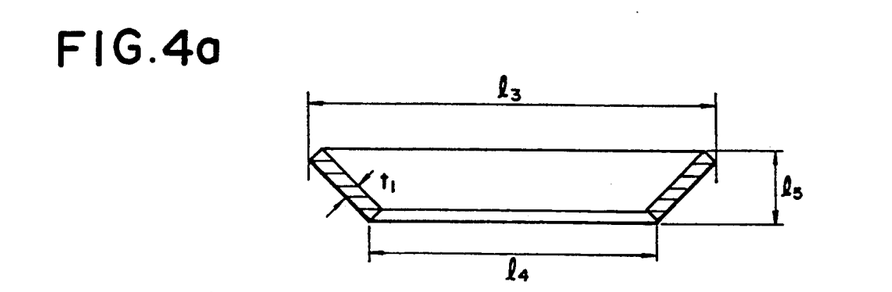
Figure 4B:
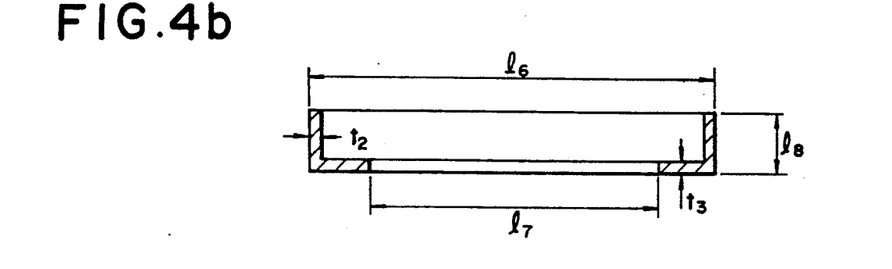
Figure 4C:
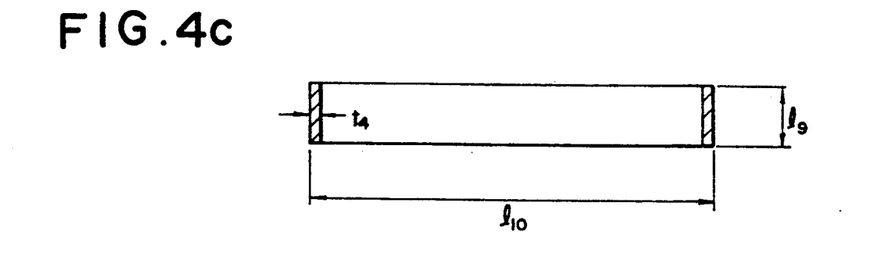

The heat shielding member of the present invention is formed into a cylindrical shape. As shown in FIGS. 4a, 4b and 4c, beside the cylindrical shape (FIG. 4c), the truncated-cone shape (FIG. 4a) and the cylindrical shape additionally having at its bottom a flange formed with a central opening (FIG. 4b) are each applicable as its cross-sectional shape.

BEST MODE FOR CARRYING OUT THE INVENTION

An embodiment of the present invention will be described in detail with reference to the accompanying drawings.

Figure 1:
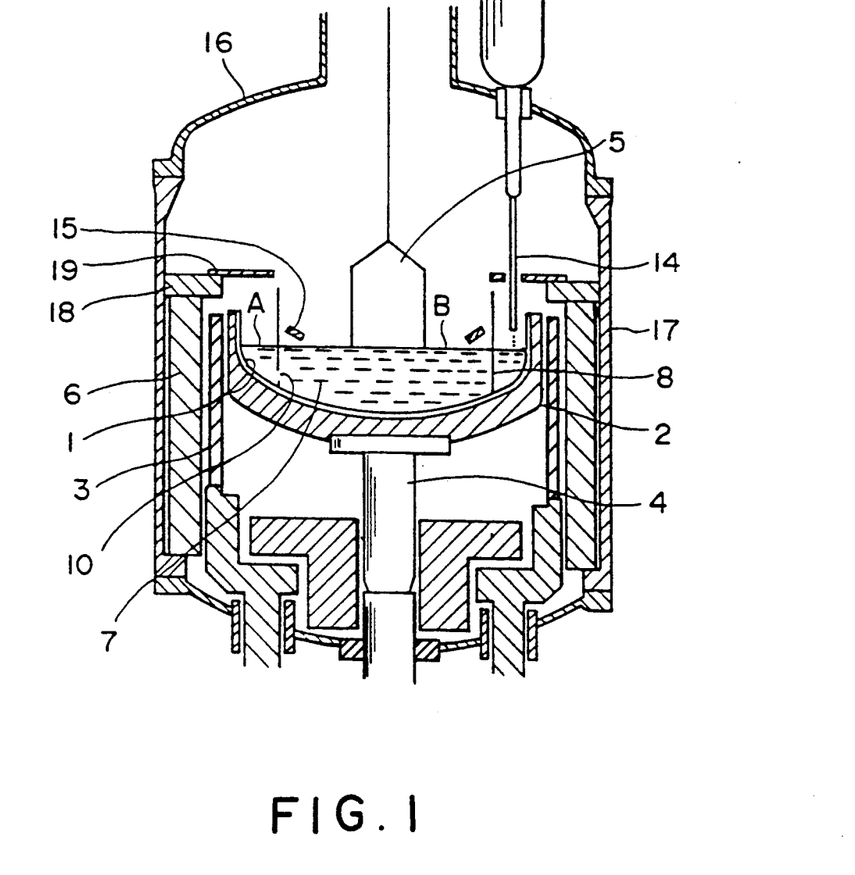
FIG. 1 is a longitudinal sectional view of a silicon single crystal manufacturing apparatus according to an embodiment of the present invention.
Figure 2:
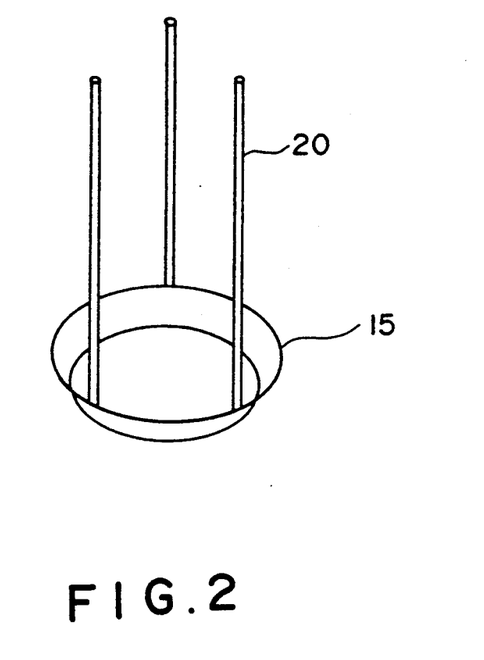
FIG. 2 is a perspective view of the heat shielding member in the embodiment of FIG. 1.
Figure 3:
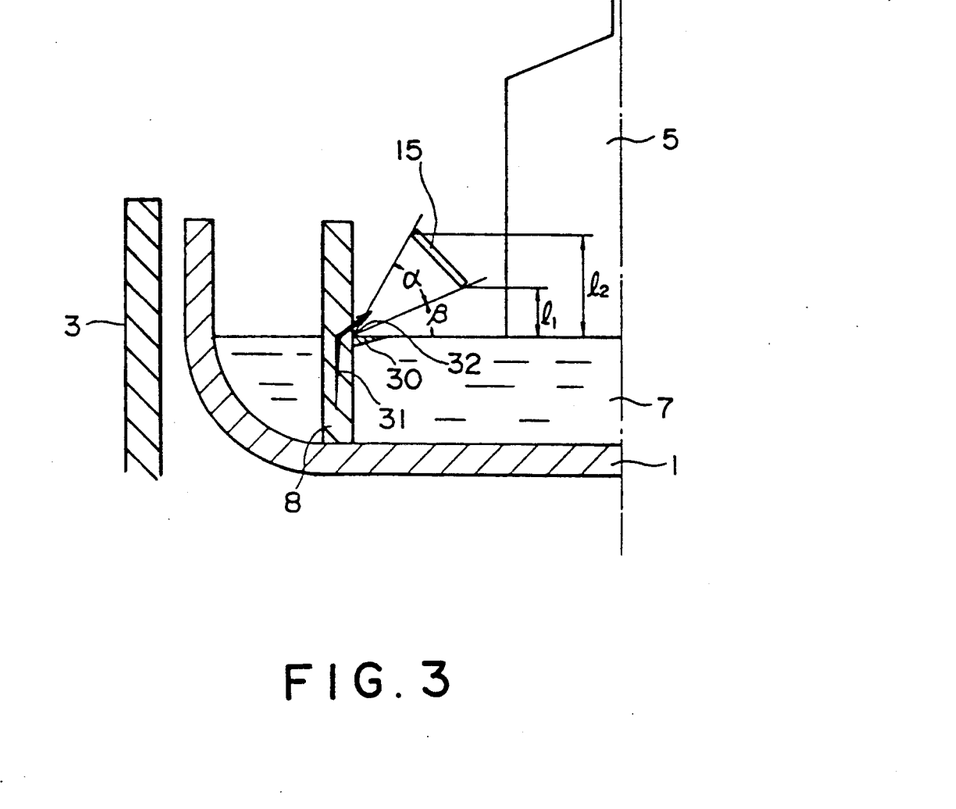
FIG. 3 is a diagram for explaining the heat shielding member in the embodiments of FIG. 1, FIGS. 4a, 4b and 4c are sectional views showing shapes of the heat shielding member in the embodiments of the present invention, FIGS. (5a and 5b) illustrates diagrams showing the effect of the cellular partition member.

In FIGS. 1 and 3, numeral 1 designates a rotation-type quartz crucible which is set in a graphite crucible 2. The graphite crucible 2 is supported on a pedestal 4. The pedestal 4 is coupled to an electric motor (not shown) externally of the furnace and it serves a function of imparting rotary motion to the graphite crucible 2. Numeral 7 designates molten silicon contained in the crucible 1 and a silicon single crystal 5 grown into a cylindrical shape of over 5 inches in diameter is pulled from the molten silicon 7. Numeral 3 designates an electric resistance heater surrounding the graphite crucible. The foregoing are basically the same with a silicon single crystal manufacturing apparatus according to the ordinary Czochralcci method.

Numeral 8 designates a partition member made of a high-purity cellular silica glass and arranged within the crucible 1 so as to be concentric therewith. This partition member 8 is formed with small holes 10 so that the molten silicon 7 flows into a single crystal growing section B through these small holes. The lower edge portion of the partition member 8 is preliminarily fused to the crucible 1 or fused to it by the heat produced when melting silicon starting material, and the high temperature molten silicon 7 in a material melting section A flows into the single crystal growing section B through the small holes.

Figure 6:
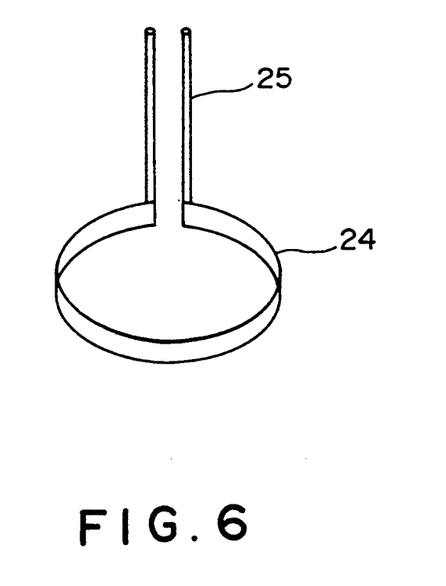
FIG. 6 shows another embodiment of the heat shielding member according to the present invention.

Numeral 15 designates a heat shielding member arranged on the single crystal growing section B side of the partition member 8 so as to be concentric with the partition member so that heat radiation 32 from a meniscus portion neighborhood 32 to the single crystal growing section B side of the partition member 8 is reduced and the occurrence of solidification 30 at this portion is prevented. This heat shielding member 15 is made of carbon or metal, preferably molybdenum or tantalum and is hung from a chamber upper cover 16 by means of suspension rods 20 shown in FIG. 20. In addition, as shown in FIG. 6, the heat shielding member may be provided with electrodes 25 to permit the supply of current and thereby to form it into an electric resistance heater 24. Also, by varying the output (the amount of heat) of the electric resistance heater 24, it is possible to control the heat radiation in a more preferred condition.

Numeral 19 designates a heat keeping member for suspending and supporting the heat shielding member 15 and it is arranged on a heat insulating member 18. The heat keeping member 19 can advantageously increase the molten silicon temperature in the material melting section A. This supporting method may still be sufficient if it is not for the electric resistance heater 24. Numeral 14 designates starting material feed means including an opening above the material melting section A so that the granular silicon starting material is supplied to the material melting section A through the starting material feed means 14. The starting material feed means 14 is coupled to a starting material feed chamber (not shown) arranged on the outer side of the chamber upper cover 16 and the granular silicon starting materials is fed continuously. Also, though not shown, a pull mechanism for pulling a silicon single crystal is arranged.

Figure 5A:
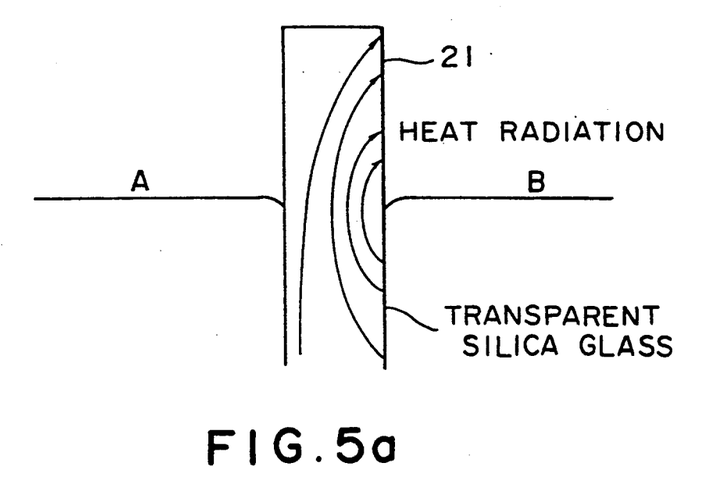
Figure 5B:
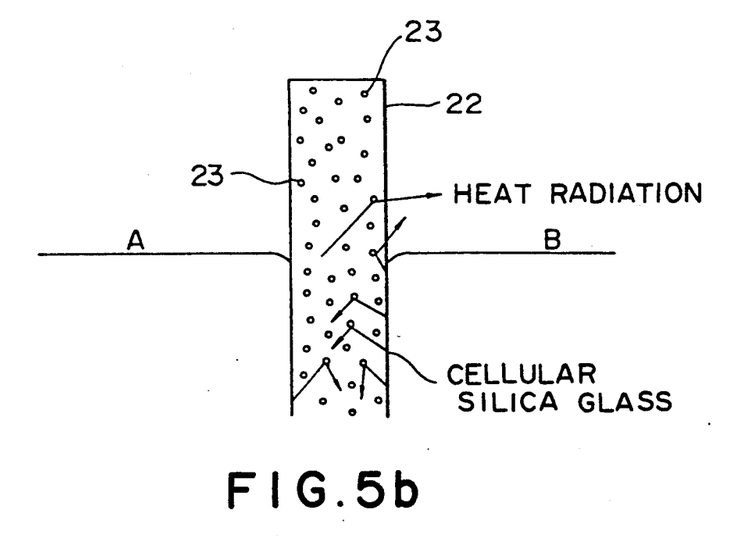

With the construction described above, the silicon single crystal manufacturing apparatus according to the present embodiment, particularly the operation of the cell-containing partition member 8 and the heat shielding member 15 will be described. FIG. 5 shows longitudinal sectional views of the partition member 8 and FIGS. 5a and 5b respectively show a transparent quartz silica glass 21 and a cell-containing cellular quartz silica glass 22 for the partition member with the figures showing the effect of the cells.

In FIGS. 5a and 5b, designated at A and B are respectively the material melting section and the silicon single crystal growing section of FIG. 1, and numeral 23 designates cells. The dissipation of heat from the partition member 8 is limited to its part near the molten silicon surface and this tendency is promoted with increase in the content of the cells 23 in the quartz material of the partition member 8. The increase in the cell content is also effective in deteriorating the capacity of the partition member 8 to upwardly transmit the heat in the molten silicon. As the result of the cells 23 contained in the partition member 8, the transparancy of the quartz is reduced with increase in the cell content so that as the cell content is increased, the chances of the light or radiant heat being scattered by the cells 23 are increased. In other words, the upward transmission of the radiant heat tends to become more difficult within the molten silicon as the transparancy of the partition member is decreased. Further, as the result of the suppression of the upward propagation, the tendency of limiting the part of the external heat radiation to the neighborhood 32 of the meniscus portion is intensified on the molten silicon surface.

In such condition where the position of the heat radiation from the partition member is limited to the neighborhood 32 of the meniscus portion, there is no need to completely cover the partition member with the heat shielding member as in the cases of Laid-Open Pat. No. 1-153589. Its function can be fully exhibited by covering only the meniscus portion neighborhood 32. The direction of the heat dissipitation from the partition member 8 is confined to the single crystal growing section B side due to the presence of the electric resistance heater 3 on the material melting section A side. In other words in the system on the whole there is the occurrence of heat flow from the A side to the B side.

Next, the function of the heat shielding member 15 will be explained with reference to FIG. 3. FIG. 3 is a longitudinal sectional view showing the neighborhood of the heat shielding member 15 of FIG. 1 in an enlarged form. The intensity of the heat shielding in effect of the heat shielding member 15 is determined by an angle $\alpha$ facing the section of the heat shielding member 15 from the meniscus portion neighborhood 32 and an angle $\beta$ facing the gap between the heat shielding member lower end and the molten silicon surface from the previously mentioned contact point. The limitations to the preferred values of the angles $\alpha$ and $\beta$ and the position of the heat shielding member are as mentioned previously.

Various material including carbon materials, ceramics such as silicon carbide and alumina, metals such as molybdenim and tantalum and so on may be considered as materials for the heat shielding member 15. However, metal materials are the most suitable ones from the standpoint of heat shielding effect, handling easiness, etc.

If current is supplied to the heat shielding member 15 to function as a heating element, the effect of providing it with become more apparent. In other words, it is possible to completely prevent the action of the heat shielding member 15 which still remains considerably even if the heat shielding member 15 is arranged properly, that is, its action of shielding the heat radiation to the silicon single crystal. In addition it further intensifies the action of the heat shielding member which suppresses the dissipation of heat from the partition member 8.

The preferred range for the cell content of the partition member 8 is between 0.01 and 15%. The lower limit is set to 0.01% on the ground that if it is not greater than this value, the transparrency reducing action of the cells is excessively weak. The upper limit is set to 15% in the ground that if it is not less than this value, the stable single crystal growth cannot be effected readily. The reason for this resides in that the chances of the cells cracking out to produce broken pieces of quartz are increaded with increase in the cell content. It is needless to say that the presence of the cells in the molten silicon is extremely detrimental to the growing of a silicon single crystal. The cells in the quartz grow when the quartz is exposed to a high-temperature and low-pressure condition for a long period of time. As a result, the above-mentioned content represents a value upon the silicon single crystal growth. This value can be known by measuring the crucible after the crystal growth.

Next, a description will be made of working examples in which silicon single crystals of 6 inches in diameter are grown by citing numerical values concretely.

FIG. 4a, 5b and 4c show examples of the perspective shape of the eat shielding member 15. The working conditions concerning these examples are as follows. Where the shape of the heat shielding member 15 is as shown in FIG. 4a, a heat shielding member made of a molybdenum sheet of a thickness $t_1$ of 1 mm having $l_3 = 380$ mm, $l_4 = 320$ mm and $l_5 = 20$ mm is arranged at a position where the distance between its lower end and the molten silicon surface is 10 mm, and a partition member having a cell content (volume percentage) of 0.5% is used. Where the shape of the heat shielding member made of a molybdenum sheet of thicknesses $t_2$ and $t_3$ of 5 mm and having $l_6 = 360$ mm, $l_7 = 300$ mm and $l_8 = 30$ mm is arranged at a position where the distance between its lower end and the molten silicon surface is 20 mm, and a partition member having a cell content (volume percentage) of 0.1 % is used. Where the shape of the heat shielding member 15 is as shown in FIG. 4c, a heat shielding member made of a graphite sheet having a thickness $t_4$ of 7 mm and having applied onto its surface a silicon carbide coating of 150 μm with $l_9 = 50$ mm and $l_{10} = 360$ mm is arranged at a position where the distance between its lower end and the molten silicon surface is 10 mm, and a partition member having a cell content (volume percentage) of 1 % is used.

Where the electric resistance heater 24 shown in FIG. 6 is used in place of the heat shielding member 15 and its cross-sectional shape is as shown in FIG. 4c, an electric resistance heater made of graphite having a thickness $t_4$ of 5 mm to have $l_9 = 30$ mm and $l_{10} = 360$ mm is arranged at a position where the distance between its lower end and the molten silicon surface is 20 mm, and a partition member having a cell content (volume percentage) of 0.05 % is used.

The principal silicon single crystal growing conditions other than those relating to the heat shielding member are substantially fixed and they are as follows.

Diameter of the quartz crucible = 20 inches
Diameter of the partition member = 16 inches
Rotational speed of the crucible = 10 rpm
Rotational speed of the silicon single crystal = 20 rpm
Pull rate of the silicon single cystal = about 1 /min.

In any of these working examples, there is no occurrence of solidification at the partition member in the vicinity of the meniscus positon and a stable silicon single crystal is grown.

INDUSTRIAL APPLICABILITY

In accordancde with the present invention, by virtue of the fact that a heat shielding member is arranged to face a partition member only in the vicinity of a meniscus position and cell-containing quarz material is used as a quartz material for the partition member, there is the effect of preventing the occurrence of solidification at the partition member and also properly maintaining the atmosphere temperature for a silicon single crystal during its growth, thereby growing the silicon single crystasl involving the occurrence of no dislocation die to thermal stresses and stability.

We clain:

1. A silicon single crystal manufacturing appartus provided with,
    a rotating quartz crucible containing molten silicon and an electric resistance heater for heating said quartz crucible from the side therof,
    a partition member arranged to divide said molten silicon into a single crystal growing section and a material melting section within said quartz crucible, having small holes for causing said molten silicon to flow out from said material melting section toward said single crystal growing section and made of a quartz material containing cells,
    starting material feed means for feeding granular silicon starting material to said material melting section, and
    pull means for pulling a silicon single crystal from said single crystal growing section;
    which comprises a cylindrical heat shielding member arranged such that a distance $l_2$ between an upper end of said cylindrical heat shielding member and said molten silicon surface is $l_2 \leq 100$ mm, above the molten silicon surface in said single crystal growing section,
    having installed in relation to face a width of said cylindrical heat shielding member in an angle $\alpha$ from a contact portion between an inner peripheral surface of said partition member and a surface of said molten silicon and thereby to reduce the radiation of heat from said contact portion;
    and in relation of an angle $\beta$ facing a distance between a lower end of said cylindrical heat shielding member and said molten silicon surface from the contact point,
    in that said angle $\alpha$ is $\alpha \geq 60° - \beta$ when said angle is $2° \leq \leq 30°$,
    in that said angle $\alpha$ is $\alpha > 30°$ when said angle is $30° < \leq 50°$ and in that said angle $\alpha$ is $\alpha \geq 80° - \beta$ when said angle is $50° < \leq 60°$.

2. A silicon single crystal manufacturing apparatus according to calim 1, wherein the shape of said cylindrical heat shielding member is a truncated-cone-shape.

3. A silicon single crystal manufacturing apparatus according to claim 1, wherein the shape of said cylindrical heat shielding member is a cylindrical shape formed at a base thereof with a flanged bottom portion having a central opening.

4. A silicon single crystal manufacturing apparatus according to claim 1, wherein the material of said cylindrical heat shielding member is a metal.

5. A silicon single crystal manufacturing apparatus according to claim 2, wherein the material of said cylindrical heat shielding member is a metal.

6. A silicon single crystal manufacturing apparatus according to claim 3, wherein the material of said cylindrical heat shielding member is a metal.

7. A silicon single crystal manufacturing apparatus according to claim 1, wherein said cylindrical heat shielding member is an electric resistance heater.

8. A silicon single crystal manufacturing apparatus according to claim 2, wherein said cylindrical heat shielding member is an electric resistance heater.

9. A silicon single crystal manufacturing apparatus according to claim 3, wherein said cylindrical heat shielding memer is an electric resistance heater.

10. A silicon single crystal manufacturing apparatus according to claim 4, wherein the metal material of said cylindrical heat shielding member is molybdenum or tantalum.

11. A silicon single crystal manufacturing apparatus according to claim 5, wherein the metal material of said cylindrical heat shielding member is molybdenum or tantalum.

12. A silicon single crystal manufacturing apparatus according to claim 6, wherein the metal material of said cylindrical heat shielding member is molybdenum or tantalum.

13. A silicon single crystal manufacturing apparatus according to claim 7, wherein said electric resistance heater is so constructed that its output (amount of heat) is variable.

14. A silicon single crystal manufacturing apparatus according to claim 8, wherein the metal material of said cylindrical heat shielding member is molydbenum or tantalum.

15. A silicon single crystal manufacturing apparatus according to claim 9, wherein the metal material of said cylindrical heat shielding member is molybdenum or tantalum.

* * * * *